United States Patent
Moreschini (10) Patent No.: US 12,258,662 B2
(45) Date of Patent: Mar. 25, 2025

(54) PRECURSOR DELIVERY SYSTEMS, PRECURSOR SUPPLY PACKAGES, AND RELATED METHODS

(71) Applicant: ENTEGRIS, INC., Billerica, MA (US)

(72) Inventor: Paolo Moreschini, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 118 days.

(21) Appl. No.: 17/896,964

(22) Filed: Aug. 26, 2022

(65) Prior Publication Data

US 2023/0068384 A1    Mar. 2, 2023

Related U.S. Application Data

(60) Provisional application No. 63/240,185, filed on Sep. 2, 2021.

(51) Int. Cl.
| | | |
|---|---|---|
| *B01J 7/00* | (2006.01) | |
| *B01J 4/00* | (2006.01) | |
| *B01J 4/02* | (2006.01) | |
| *C23C 16/08* | (2006.01) | |
| *C23C 16/448* | (2006.01) | |

(52) U.S. Cl.
CPC ............... *C23C 16/08* (2013.01); *B01J 4/008* (2013.01); *B01J 4/02* (2013.01); *C23C 16/4485* (2013.01); *B01J 7/00* (2013.01)

(58) Field of Classification Search
None
See application file for complete search history.

(56) References Cited

U.S. PATENT DOCUMENTS

| | | |
|---|---|---|
| 8,784,763 B2 | 7/2014 | Luly et al. |
| 2012/0018012 A1 | 1/2012 | Street et al. |
| 2012/0318403 A1 | 12/2012 | Cohen et al. |
| 2016/0244331 A1 | 8/2016 | Saito et al. |

FOREIGN PATENT DOCUMENTS

| | | |
|---|---|---|
| CA | 2731838 A1 | 2/2010 |
| CN | 1339401 A | 10/2003 |
| CN | 102976303 A | 3/2013 |
| JP | 2000154009 A | 6/2000 |
| KR | 102123068 B1 * | 6/2020 |

OTHER PUBLICATIONS

Joon, B. KR102123068B1-translated document (Year: 2020).*

* cited by examiner

*Primary Examiner* — Jelitza M Perez (57) ABSTRACT

Some embodiments relate to precursor delivery systems for producing gas precursors. The precursor delivery system may include one or more precursor supply packages containing a solid precursor material. The one or more precursor supply packages may be configured to heat the solid precursor material to a temperature sufficient to result in thermal decomposition of the solid precursor material. The thermal decomposition of the solid precursor material may produce a gas precursor. The gas precursor may be supplied to a gas precursor-utilizing process. Further embodiments relate to precursor supply packages and related methods.

9 Claims, 4 Drawing Sheets

PRECURSOR DELIVERY SYSTEMS, PRECURSOR SUPPLY PACKAGES, AND RELATED METHODS

CROSS-REFERENCE TO RELATED APPLICATIONS

This application claims the benefit under 35 USC 119 of U.S. Provisional Patent Application No. 63/240,185, filed Sep. 2, 2021, the disclosure of which is hereby incorporated herein by reference in its entirety.

FIELD

This disclosure generally relates to precursor delivery systems, precursor supply packages, and related methods.

BACKGROUND

Gas precursors for use in various industrial applications are stored and transported as adsorbed gas or compressed gas. These techniques are expensive and complicated. In addition, efforts to transport vaporizable solid precursors pose technical and operational challenges with respect to reliability, reproducibility, and quality, among other things.

SUMMARY

Some embodiments relate to a precursor supply package. The precursor supply package may include a vessel body containing a solid precursor material. The precursor supply package may include a heater configured to heat the vessel body to a temperature sufficient to produce a gas precursor by thermal decomposition of the solid precursor material. In some embodiments, the gas precursor includes $PF_5$. The precursor supply package may include an outlet fluidly connected to the vessel body.

In some embodiments, the solid precursor material includes a metal hexafluorophosphate.

In some embodiments, the solid precursor material has a formula $MPF_6$, wherein M is Li, Na, K, Rb, Cs, or Ag.

In some embodiments, the solid precursor material includes at least one of $HPF_6$, $LiPF_6$, $NaPF_6$, $KPF_6$, $RbPF_6$, $CsPF_6$, $NH_4PF_6$, $AgPF_6$, $Mg(PF_6)_2$, $Ca(PF_6)_2$, $Ba(PF_6)_2$, $Zn(PF_6)_2$, $Cu(PF_6)_2$, $Pb(PF_6)_2$, $Al(PF_6)_2$, $Fe(PF_6)_2$, or any combination thereof.

Some embodiments relate to a precursor delivery system. The precursor delivery system includes a plurality of precursor supply packages. Each of the plurality of precursor supply packages includes a vessel body containing a solid precursor material, a heater configured to heat the vessel body to a temperature sufficient to produce a gas precursor by thermal decomposition of the solid precursor material wherein the gas precursor includes $PF_5$, and an outlet fluidly connected to the vessel body. The precursor delivery system further includes a manifold fluidly connected to the plurality of precursor supply packages and an outlet fluidly connected to the manifold.

In some embodiments, the solid precursor material includes a metal hexafluorophosphate.

In some embodiments, the solid precursor material has a formula $MPF_6$, wherein M is Li, Na, K, Rb, Cs, or Ag.

In some embodiments, the solid precursor material includes at least one of $HPF_6$, $LiPF_6$, $NaPF_6$, $KPF_6$, $RbPF_6$, $CsPF_6$, $NH_4PF_6$, $AgPF_6$, $Mg(PF_6)_2$, $Ca(PF_6)_2$, $Ba(PF_6)_2$, $Zn(PF_6)_2$, $Cu(PF_6)_2$, $Pb(PF_6)_2$, $Al(PF_6)_2$, $Fe(PF_6)_2$, or any combination thereof.

In some embodiments, at least one heater is configured to heat at least one vessel body to a temperature that is greater than a thermal decomposition temperature of the solid precursor material.

In some embodiments, at least one heater is configured to maintain at least one vessel body at a temperature that is greater than a thermal decomposition temperature of the solid precursor material.

In some embodiments, the manifold is configured to control withdrawal of the gas precursor from each of the plurality of precursor supply packages.

In some embodiments, the precursor delivery system further includes a pressure transducer.

In some embodiments, a pressure below a set pressure as determined by the pressure transducer indicates the solid precursor material, which is contained in the vessel body of the precursor supply package producing the gas precursor, is depleted.

In some embodiments, the precursor delivery system further includes a pressure regulator valve.

In some embodiments, the pressure regulator valve is configured to maintain a pressure of the gas precursor through the outlet at or below atmospheric pressure.

Some embodiments relate to a method of supplying a gas precursor. The method includes one or more of the following steps: obtaining a first vessel containing a solid precursor material, heating the first vessel to a temperature sufficient to result in thermal decomposition of the solid precursor material to produce a gas precursor including $PF_5$; and supplying the gas precursor from the first vessel to a downstream process.

In some embodiments, the solid precursor material includes a metal hexafluorophosphate.

In some embodiments, the solid precursor material includes $LiPF_6$ and the gas precursor includes $PF_5$.

In some embodiments, the method further includes one or more of the following steps: obtaining a second vessel containing the solid precursor material; heating the second vessel, concurrently with the first vessel, to a temperature sufficient to result in thermal decomposition of the solid precursor material to produce the gas precursor; and before the solid precursor material is depleted in the first vessel, supplying the gas precursor from the second vessel to the downstream process.

In some embodiments, the method further includes one or more of the following steps: obtaining a third vessel containing the solid precursor material; heating the third vessel, concurrently with the second vessel, to a temperature sufficient to result in thermal decomposition of the solid precursor material to produce the gas precursor; and before the solid precursor material is depleted in the second vessel, supplying the gas precursor from the third vessel to the downstream process.

BRIEF DESCRIPTION OF THE DRAWINGS

Reference is made to the drawings that form a part of this disclosure, and which illustrate embodiments in which the materials and methods described herein can be practiced.

DETAILED DESCRIPTION

Some embodiments relate to precursor delivery systems, precursor supply packages, and related methods for producing a gas precursor by thermal decomposition of a solid precursor material. The precursor deliver systems are useful for containing a solid precursor material and producing a gas precursor for supply to a downstream process. The gas precursor is produced by heating the solid precursor material to a temperature sufficient to result in thermal decomposition of the solid precursor material. In the absence of heating, the solid precursor material generally exists in a stable solid state. In this way, the precursor delivery systems and precursor supply packages disclosed herein may store solid precursor materials until there is a demand for the gas precursor and, in response to said demand, the precursor delivery systems may be operated to produce the gas precursor for supply to a downstream process. When implemented with a monitoring and control system, the precursor delivery systems may provide a constant uninterrupted supply of the gas precursor to the downstream process.

Figure 1:
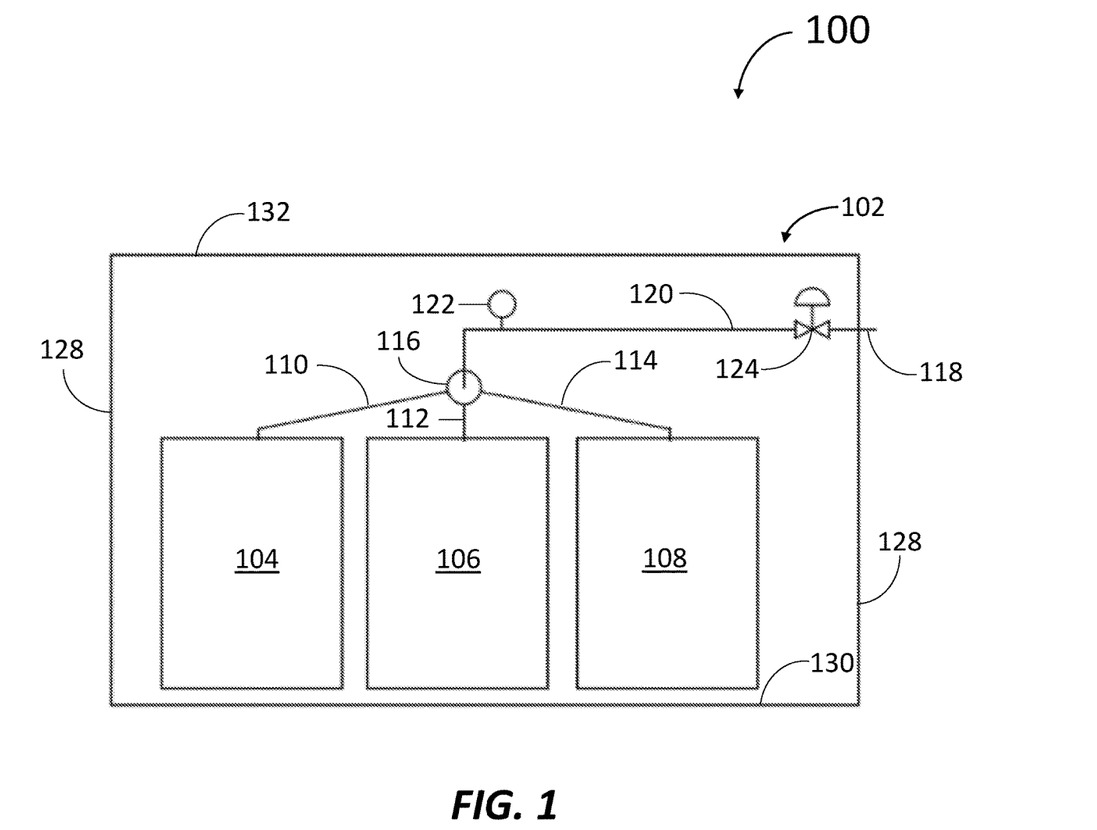
FIG. 1 is a schematic diagram of a precursor delivery system, according to some embodiments of the present disclosure.

FIG. 1 is a schematic diagram of a precursor delivery system 100, according to some embodiments of the present disclosure.

The precursor delivery system 100 includes a system enclosure 102. The system enclosure 102 includes a precursor supply package 104, a precursor supply package 106, and a precursor supply package 108, each of which may be of the same or similar construction. Discharge lines 110, 112, 114 fluidly connect respective precursor supply packages 104, 106, 108 to a manifold 116. The manifold 116 is fluidly connected to an outlet 118 by delivery line 120. The delivery line 120 includes a pressure transducer 122 for measuring a pressure of a gas precursor in the delivery line 120 and a pressure regulator 124 for minimizing or stabilizing pressure fluctuations of the gas precursor exiting the precursor delivery system 100 through the outlet 118.

It is to be appreciated that the number of precursor supply packages may vary from the three precursor supply packages presented in the illustrated embodiment. In general, the precursor delivery system 100 may include one or more precursor supply packages without departing from this disclosure. For example, in some embodiments, the number of precursor supply packages may be less than three. In other embodiments, the number of precursor supply packages may be greater than three.

The precursor supply packages 104, 106, 108 are capable of containing a solid precursor material until there is a demand and, in response to such demand, producing a gas precursor for supply to a downstream process. To produce the gas precursor, the precursor supply packages 104, 106, 108 are configured to heat the solid precursor material to a temperature sufficient to result in thermal decomposition of the solid precursor material. A temperature sufficient to result in thermal decomposition of the solid precursor material includes any temperature at or above a thermal decomposition temperature of the solid precursor material. The thermal decomposition temperature may be a minimum temperature at which the solid precursor material undergoes thermal decomposition. The thermal decomposition temperature may be specific to the solid precursor material and thus may depend on the solid precursor material employed. In some embodiments, the thermal decomposition temperature may also be dependent on the conditions under which the thermal decomposition process is carried out (e.g., temperature, pressure, etc.). The thermal decomposition of the solid precursor material produces the gas precursor. The gas precursor comprises the thermal decomposition product of the solid precursor material.

The precursor supply packages 104, 106, 108 may be configured to be operated and controlled independent of each other. For example, the precursor supply packages 104, 106, 108 may be configured to independently apply heat to the solid precursor material to produce the gas precursor. Being independently heated, at least one of the precursor supply packages 104, 106, 108 may be maintained at or above the thermal decomposition temperature to produce the gas precursor, while at least one of the precursor supply packages 104, 106, 108 may not be heated. For example, in some embodiments, the gas precursor may be produced in the precursor supply packages 104, 106, while the gas precursor is not produced in the precursor supply package 108. In addition, the gas precursor may be withdrawn from the precursor supply package 104, but not from the precursor supply package 106. The gas precursor present in the precursor supply package 106 may provide a secondary supply of the gas precursor in case of a supply interruption. For example, prior to complete exhaustion of the solid precursor material in the precursor supply package 104, the gas precursor may switch to being withdrawn from the precursor supply package 106. At about the same time, the precursor supply package 108 may be heated to renew the secondary supply of the gas precursor. In this way, the precursor delivery system 100 may provide a continuous uninterrupted supply of the gas precursor to the downstream process.

The manifold 116 may include one or more inlet ports fluidly connecting the manifold 116 to the precursor supply packages 104, 106, 108. The manifold 116 may include manifold controls for controlling the dispensing of the gas precursor from each of the precursor supply packages 104, 106, 108. For example, in some embodiments, the manifold 116 includes a flow control assembly (e.g., a switching assembly) for switching from withdrawal of the gas precursor from at least one of the precursor supply packages 104, 106, 108 to at least one of the other precursor supply packages 104, 106, 108. The flow control assembly may be an automated flow control assembly responsive to signals from, for example, the pressure transducer. In some embodiments, the flow control assembly includes a flow path selector. In some embodiments, the flow control assembly includes a pneumatically actuated valve. The flow control assembly may include additional elements. For example, the manifold 116 may include instrumentation for monitoring process conditions (e.g., pressure, temperature, flow rate, etc.) of the gas precursor being dispensed from the precursor supply packages 104, 106, 108, flow control valves, mass flow controllers, any combination thereof, and the like.

The precursor supply packages 104, 106, 108, the manifold 116, and other elements and components of the precursor delivery system 100 may be housed in the system enclosure 102. In some embodiments, the system enclosure 102 is a cabinet assembly. The cabinet assembly may include sidewalls 128, a floor 130, and a ceiling 132 configured and arranged to obtain the system enclosure 102. In some embodiments, the cabinet assembly may be equipped with doors or other structural features that provide access to the interior or installed components of the precursor delivery system 100. In some embodiments, the cabinet assembly includes one or more securing members, such as, for example and without limitation, at least one of the following: strap fasteners; neck rings; depressions or cavities formed in the floor of the gas cabinet for matably receiving the precursor supply packages 104, 106, 108; and guide members or compartment structures that retain the precursor supply packages 104, 106, 108 in a desired position in the interior volume of the cabinet assembly, or any combination thereof. In some embodiments, one or more of the manifold 116, the discharge lines 110, 112, 114, the delivery line 120, the pressure transducer 122, and the pressure regulator 124 are installed in or on the cabinet assembly. In this way, the cabinet assembly may be configured and dimensioned for transporting the precursor supply packages 104, 106, 108 from one location to another location. It will be appreciated that the cabinet assembly is provided as an example and that other system enclosures may be used herein without departing from this disclosure. In other embodiments, the system enclosure 102 may include any structure capable of housing the various components and elements of the precursor delivery system 100.

Upon exiting the system enclosure 102, the gas precursor may be supplied to a downstream process. In some embodiments, the gas precursor is conveyed and/or discharged to the downstream process at atmospheric pressure or a sub-atmospheric pressure. The downstream process may include any gas precursor-utilizing process. The downstream process may include a semiconductor fabrication process. In some embodiments, the downstream process includes any one or more of the following processes: ion implantation, epitaxial growth, plasma etching, reactive ion etching, metallization, physical vapor deposition, chemical vapor deposition, plasma deposition, photolithography, cleaning, doping, and the like, among others. In some embodiments, these processes are part of the manufacture process of semiconductor devices and products, microelectronic devices and products, photovoltaic devices and products, or flat-panel display devices and products, and the like. Other processes may be used herein without departing from this disclosure.

The precursor delivery system 100 may be provided in other arrangements and configurations, with additional elements. The additional elements may include additional flow lines and flow circuitry components, such as, for example and without limitation, at least one of flow path selectors, flow control valves; mass flow controllers; pressure regulators; restricted flow orifice elements; thermocouples; monitoring and control devices, such as, process gas monitoring instrumentation for monitoring the process conditions of the gas precursor being dispensed from the precursor supply packages, such as, for example and without limitation, pressure, temperature, flow rate, concentration, and the like; leak detection devices; automated purge equipment and associated actuators for purging the precursor delivery system or any component thereof when a leak is detected from one or more of the precursor supply packages; heaters for input of thermal energy to the precursor supply packages and their contents; heaters for maintaining temperature in the discharge lines and delivery line; or any combination thereof.

Figure 2:
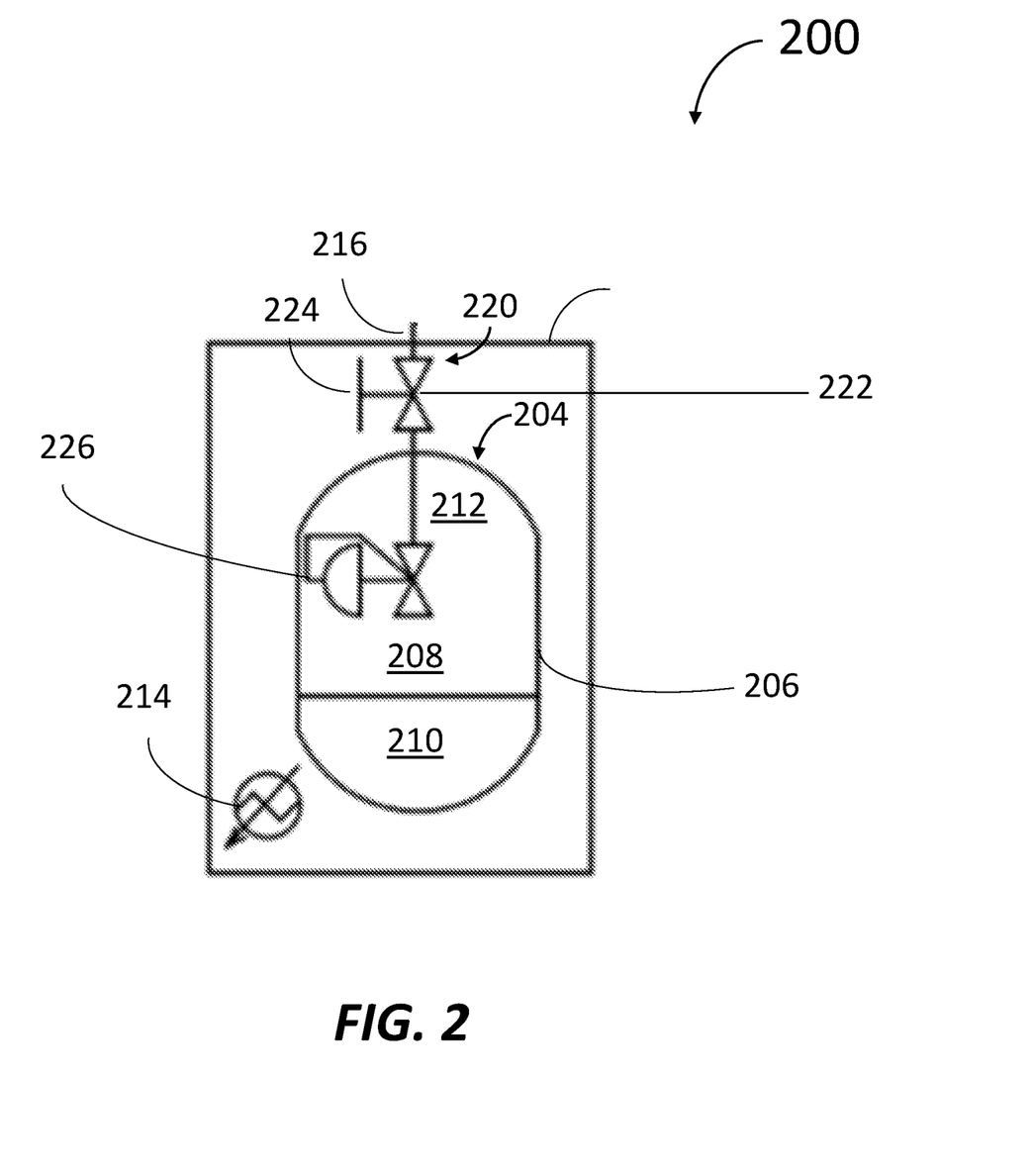
FIG. 2 is a schematic diagram of a precursor supply package, according to some embodiments of the present disclosure.

FIG. 2 is a schematic diagram of a precursor supply package 200, according to some embodiments of the present disclosure.

The precursor supply package 200 includes a containment 202. The containment 202 includes a vessel 204. The vessel 204 includes a vessel body 206 defining an interior volume 208. At least one of the solid precursor material 210, the gas precursor 212, or any combination thereof, may be disposed in the interior volume 208 of the vessel body 206. A heater 214 is included for heating the solid precursor material 210 to at least a thermal decomposition temperature. An outlet 216 may be fluidly connected to the vessel 204. The precursor supply package 200 may be used in the precursor delivery system 100 as any one or more of the precursor supply packages 104, 106, 108.

The solid precursor material 210 may include any substance capable of undergoing thermal decomposition to produce the gas precursor. In some embodiments, the solid precursor material 210 undergoes thermal decomposition to produce a gas precursor comprising phosphorus pentafluoride ($PF_5$). For example, in some embodiments, the solid precursor material 210 includes a hexafluorophosphate precursor. In some embodiments, the solid precursor material 210 includes a metal hexafluorophosphate precursor. In some embodiments, the metal hexafluorophosphate precursor includes a compound of formula: $MPF_6$, where M is a metal (e.g., a metal having a suitable valence). In some embodiments, the metal (M) includes at least one of an alkali metal, a transition metal, or any combination hereof. For example, in some embodiments, the metal (M) may comprise, consist of, or consist essentially of at least one of Li, Na, K, Rb, Cs, Ag, or any combination thereof. In some embodiments, the metal (M) may be selected from the group consisting of at least one of Li, Na, K, Rb, Cs, Ag, or any combination thereof. In some embodiments, the solid precursor material 210 may comprise, consist of, or consist essentially of at least one of $HPF_6$, $LiPF_6$, $NaPF_6$, $KPF_6$, $RbPF_6$, $CsPF_6$, $NH_4PF_6$, $AgPF_6$, $Mg(PF_6)_2$, $Ca(PF_6)_2$, $Ba(PF_6)_2$, $Zn(PF_6)_2$, $Cu(PF_6)_2$, $Pb(PF_6)_2$, $Al(PF_6)_2$, $Al(PF_6)_3$, $Fe(PF_6)_2$, or any combination thereof. In some embodiments, the solid precursor material 210 may be selected from the group consisting of at least one of $HPF_6$, $LiPF_6$, $NaPF_6$, $KPF_6$, $RbPF_6$, $CsPF_6$, $NH_4PF_6$, $AgPF_6$, $Mg(PF_6)_2$, $Ca(PF_6)_2$, $Ba(PF_6)_2$, $Zn(PF_6)_2$, $Cu(PF_6)_2$, $Pb(PF_6)_2$, $Al(PF_6)_2$, $Fe(PF_6)_2$, or any combination thereof. It is to be appreciated that other gas precursors and solid precursor materials may be employed herein without departing from this disclosure.

The vessel 204 may have any construction and configuration suitable for containing the solid precursor material 210 and producing the gas precursor for supply to the downstream process. In some embodiments, the vessel 204 includes a pressure-regulated vessel. The pressure-regulated vessel includes a valve head assembly 220 in an upper portion of the vessel body 206. The valve head assembly 220 includes a valve 222 fluidly coupled to the interior volume 208 of the vessel body 206 and to an outlet 216 of the vessel 204. A valve actuator 224 is coupled to the valve 222. The valve actuator 224 is configured to translate valve elements between an open position and a closed position, or any position between the open position and the closed position, for controllably delivering the gas precursor 212. In some embodiments, the valve actuator 224 comprises a handwheel. In some embodiments, the valve actuator 224 comprises a manual valve actuator (e.g., via a handwheel), a solenoid-operated valve actuator, a pneumatic valve actuator, or a valve actuator of another type configured to translate valve elements between the open position and the closed position, as described above. A pressure regulator 226 may be fluidly coupled to the valve head assembly 220 and at least partially disposed within the interior volume 208 of the vessel body 206. The pressure regulator 226 may be configured to maintain a downstream pressure at a set pressure (e.g., a set point pressure).

Other types of pressure-regulated vessels and precursor storage and dispensing vessels may be used herein without departing from this disclosure. Non-limiting examples of such other vessels include, without limitation, a pressure-regulated vessel including an internal gas pressure regulator, such as, for example, those of a type commercially available from Entegris, Inc. (Billerica, Mass., USA) under the trademark VAC; a pressure-regulated vessel including an internal gas pressure regulator, such as, for example, those of a type as commercially available from Entegris, Inc. (Billerica, Mass., USA) under the trademark VACSorb; other vessels, such as, for example, those of a type commercially available from Entegris, Inc. (Billerica, Mass., USA) under the trademark ProEvap.

The heater 214 is configured to apply direct or indirect heat to the solid precursor material 210 sufficient to result in thermal decomposition of the solid precursor material to produce the gas precursor 212. To heat the solid precursor material 210, the heater 214 may be in thermal communication with at least one of the containment 202, the vessel 204 or the vessel body 206, the solid precursor material 210, or any combination thereof. In some embodiments, the heater 214 is included in the containment 202. In some embodiments, the heater 214 is external to the containment 202. The heater 214 is not particularly limited so long as the heater is capable of heating to a desired temperature level, such as a thermal decomposition temperature, and maintaining such temperature level in an accurate and reliable manner.

The heating may be conducted in any suitable manner. In some embodiments, a heating jacket is employed around the vessel 204. In some embodiments, a ribbon heater is wound around the vessel 204. In some embodiments, a block heater having a shape covering at least a major portion of the external surface of the vessel 204 is employed to heat the vessel 204. In some embodiments, a resistive heater is employed to heat the vessel 204. In some embodiments, a lamp heater is employed to heat the vessel 204. In some embodiments, a heat transfer fluid at elevated temperature may be contacted with the exterior surface of the vessel 204, to effect heating thereof. In some embodiments, the heating is conducted by infrared or other radiant energy being impinged on the vessel 204. It is to be appreciated that other thermal input devices and assemblies, and other configurations and arrangements of the heater 214 may be employed herein without departing from the scope of the present disclosure. In other embodiments, the heater 214 may heat at least one of the containment 202, the vessel body 206, the solid precursor material 210, or any combination thereof.

The temperature may be any temperature sufficient to result in thermal decomposition of the solid precursor material 210 and the formation of the gas precursor 212. In some embodiments, the temperature is at least the thermal decomposition temperature of the solid precursor material 210. In some embodiments, the temperature may be a temperature selected to maximize the amount of the solid precursor material 210 that undergoes to thermal decomposition to minimize material waste and/or improve system efficiency. For example, in some embodiments, the temperature is a temperature above the thermal decomposition temperature of the solid precursor material 210. Although the thermal decomposition temperature may vary depending on the solid precursor material 210, the temperature at which or to which the solid precursor material 210 may be heated may be a temperature of 100° C. to 300° C. In some embodiments, the temperature is a temperature of 100° C. to 160° C., 110° C. to 160° C., 120° C. to 160° C., 130° C. to 160° C., 140° C. to 160° C., or 145° C. to 155° C. In other embodiments, the temperature is a temperature of 100° C. to 190° C., 100° C. to 180° C., 100° C. to 170° C., 100° C. to 160° C., 100° C. to 150° C., 100° C. to 140° C., 100° C. to 130° C., 100° C. to 120° C., 100° C. to 110° C., 110° C. to 200° C., 120° C. to 200° C., 130° C. to 200° C., 140° C. to 200° C., 150° C. to 200° C., 160° C. to 200° C., 170° C. to 200° C., 180° C. to 200° C., or 190° C. to 200° C.

Figure 3:
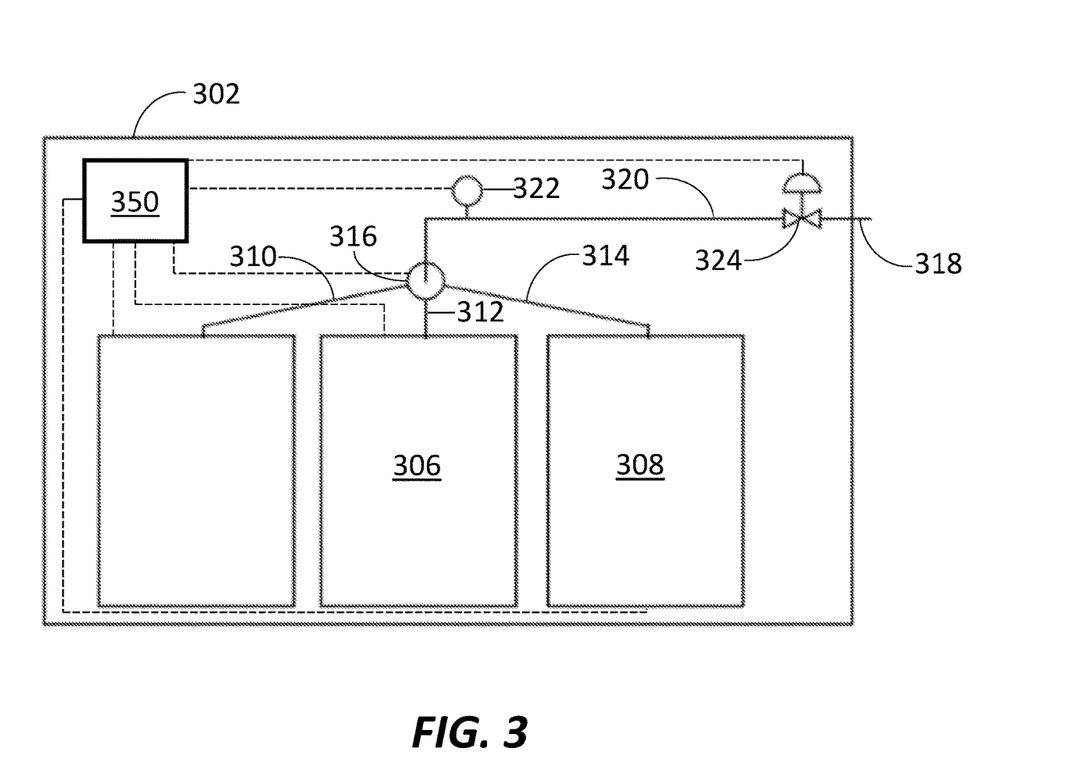
FIG. 3 is a schematic diagram of a precursor delivery system, according to some embodiments of the present disclosure.

FIG. 3 is a schematic diagram of a precursor delivery system 300, according to some embodiments of the present disclosure.

The precursor delivery system 300 includes a monitor and control system for modulating the flow parameters of the gas precursor flowing through the precursor delivery system 300. The monitoring and control system includes a processor component 350. The processor component 350 is in electronic communication with the precursor supply packages 304, 306, 308, the manifold 316, the pressure transducer 322, and the pressure regulator 324. In the schematic diagram of the precursor delivery system 300, dashed lines represent signal transmission lines.

The precursor delivery system 300 is otherwise similar to the precursor delivery system 100. The precursor supply packages 304, 306, 308 are disposed within a system enclosure 302. Discharge lines 310, 312, 314 fluidly connect respective precursor supply packages 304, 306, 308 to a manifold 316. The manifold 316 is fluidly connected to an outlet 318 by delivery line 320. The delivery line 320 includes a pressure transducer 322 for measuring a pressure of a gas precursor in the delivery line 320. The delivery line 320 further includes a pressure regulator 324 for minimizing or stabilizing pressure fluctuations of the gas precursor exiting the precursor delivery system 300 through the outlet 318 to a downstream process.

As the gas precursor flows through the precursor delivery system 300, the pressure transducer 322 measures the pressure of the gas precursor flowing through the delivery line 320. The pressure transducer 322 may output a pressure sensing signal correlative to the pressure of the gas precursor flowing through the delivery line 320. The pressure sensing signal may be transmitted to the processor component 350 for processing. Various set points may be input to the processor component 350 as comparative thresholds. For example, in some embodiments, the set point is a set pressure variance (e.g., a pressure differential or a pressure drop) used to indicate depletion or near depletion of the solid precursor material contained in the precursor supply package from which the gas precursor is being withdrawn. In some embodiments, the set point includes a second set pressure variance used to indicate pressure fluctuations (e.g., pressure spikes, oscillating pressures, etc.) in the delivery line 320.

In response to the pressure sensing signal, the processor component 350 modulates the flow of the gas precursor through the precursor delivery system 300 by transmitting a control signal to at least one of the manifold 316, the precursor supply packages 304, 306, 308, the pressure regulator 124, any components thereof (e.g., a heater, a valve actuator, etc.), or any combination thereof. In some embodiments, in response to a control signal from the processor component 350, the manifold 316 may be configured to switch from withdrawing the gas precursor from one of the precursor supply packages 304, 306, 308 to withdrawing the gas precursor from another of the precursor supply packages 304, 306, 308. In some embodiments, in response to the controls signal from the processor component 350, the manifold 316 is configured to terminate dispensing operations with respect to the precursor supply package 304 and/or initiate dispensing operations with respect to the precursor supply package 306. solid precursor material contained in the precursor supply package from which the gas precursor is being withdrawn In some embodiments, in response to a control signal from the processor component 350, at least one of the precursor supply packages 304, 306, 308 from which the gas precursor material is being supplied is configured to initiate further heating of the solid precursor material contained therein. In some embodiments, the further heating is performed, prior to terminating dispensing operations, to maximize production of the gas precursor from the solid precursor material. In some embodiments, in response to a control signal from the processor component 350, one or more of the precursor supply packages 304, 306, 308 is configured to initiate heating to produce or renew a secondary supply of the gas precursor (e.g., in case of a supply interruption, for example, depletion of the solid precursor material). After initiating heating, the heating may be maintained at a set temperature (e.g., at or above a thermal decomposition temperature of the solid precursor material).

In some embodiments, in response to a control signal from the processor component 350, the pressure regulator 324 is configured to open or close, optionally in incremental steps, to return a pressure in the flow conduit to a set pressure. In some embodiments, in response to a control signal from the processor component 350, the pressure regulator 324 is further configured to maintain the pressure in the flow conduit at the set pressure.

Figure 4:
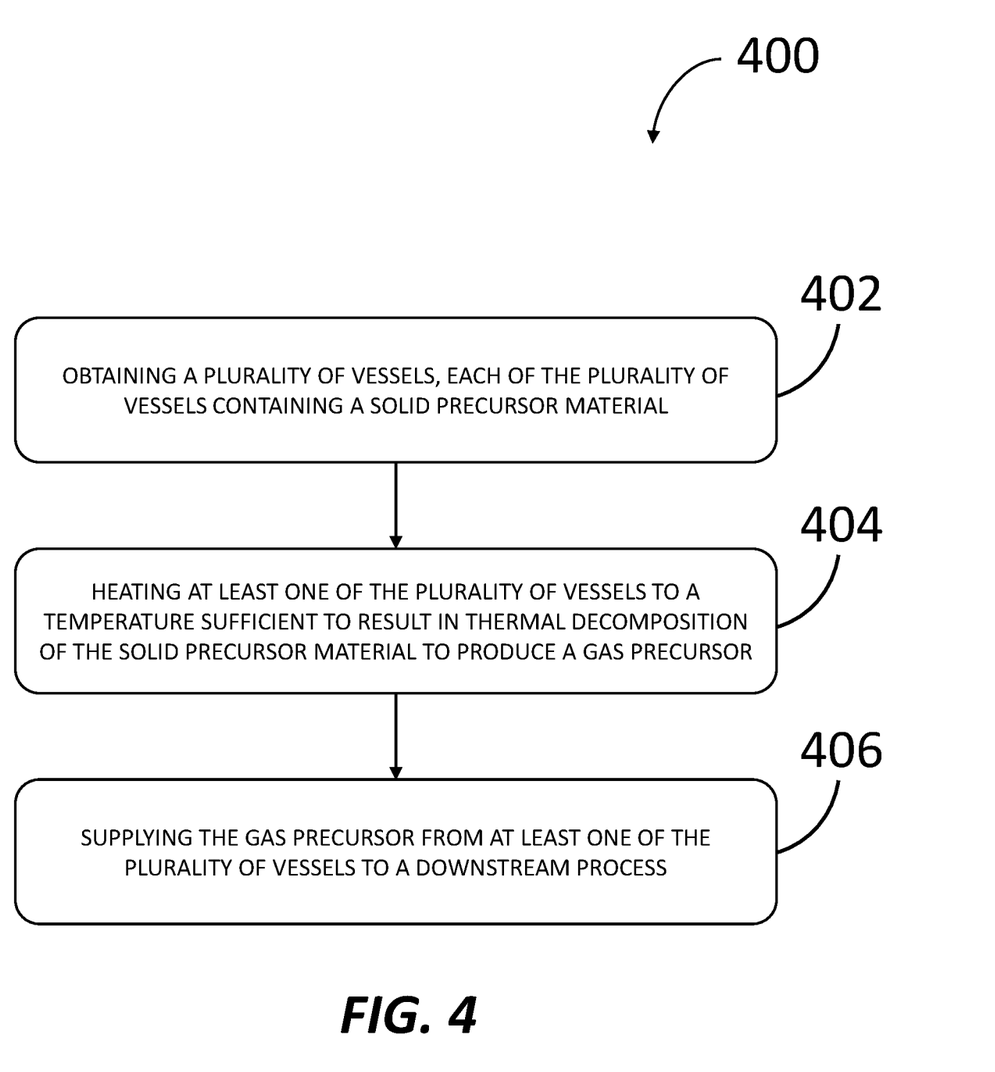
FIG. 4 is a flowchart of a method of supplying a gas precursor, according to some embodiments of the present disclosure.

FIG. 4 is a method of supplying a gas precursor, according to some embodiments of the present disclosure. The method 400 may be implemented using any of the precursor supply packages disclosed herein and any of the precursor delivery systems disclosed herein.

At step 402, the method comprises obtaining a plurality of vessels, each of the plurality of vessels containing a solid precursor material. The plurality of vessels may be included in any of precursor supply packages and/or precursor delivery systems disclosed herein. In some embodiments, step 402 includes obtaining a first vessel. In some embodiments, the step 402 includes obtaining a first vessel and a second vessel. In some embodiments, the step 402 includes obtaining a first vessel, a second vessel, and a third vessel. In other embodiments, the step 402 may include obtaining greater than three vessels.

At step 404, the method includes heating at least one of the plurality of vessels to a temperature sufficient to result in thermal decomposition of the solid precursor material to produce a gas precursor. In this step, one or more of the plurality of vessels (e.g., one or more of the first vessel, the second vessel, and the third vessel) may be heated to the temperature sufficient to result in thermal decomposition of the solid precursor material. The heating may be concurrent or sequential. In some embodiments, the heating is responsive to a measured pressure being below a set pressure as determined by a pressure transducer. The pressure being below the set pressure may indicate depletion or near depletion of the solid precursor material in the vessel from which the gas precursor is being produced. Accordingly, in some embodiments, the heating includes heating at least one of the plurality of vessels to produce a secondary supply of the gas precursor (e.g., in case of a supply interruption, etc.). The temperature to which the plurality of vessels is heated and maintained may be at or above a thermal decomposition temperature of the solid precursor material.

At step 406, the method comprises supplying the gas precursor from at least one of the plurality of vessels to a gas precursor-utilizing process. In some embodiments, the step 406 includes supplying the gas precursor from the first vessel until the solid precursor material therein is depleted or nearly depleted. Before the solid precursor material is depleted in the first vessel, the step 406 includes supplying the gas precursor from the second vessel. In some embodiments, supplying the gas precursor from the second vessel includes switching from supplying the gas precursor from the first vessel to supplying the gas precursor from the second vessel. The gas precursor may be supplied from the second vessel until the solid precursor material therein is depleted or nearly depleted. Before the solid precursor material is depleted in the second vessel, the step 406 includes supplying the gas precursor from the third vessel. In some embodiments, supplying the gas precursor from the third vessel includes switching from supplying the gas precursor from the second vessel to supplying the gas precursor from the third vessel.

What is claimed is:

1. A precursor delivery system comprising:
a plurality of precursor supply packages, each of the plurality of precursor supply packages comprising:
a vessel body containing a solid precursor material, wherein the solid precursor material has a formula MPF6, wherein M is Li, Na, K, Rb, Cs, or Ag;
a heater configured to heat the vessel body to a temperature sufficient to produce a gas precursor by thermal decomposition of the solid precursor material wherein the gas precursor comprises PF5; and
an outlet fluidly connected to the vessel body;
a manifold fluidly connected to the plurality of precursor supply packages; and an outlet fluidly connected to the manifold;
the manifold is configured to switch from withdrawing the gas precursor from one of the precursor supply packages to withdrawing the gas precursor from another of the precursor supply packages in response to a pressure sensing signal, wherein the pressure sensing signal is configured to initiate heating to the another precursor supply package.

2. The precursor delivery system of claim 1, wherein the solid precursor material includes at least one of $LiPF_6$, $NaPF_6$, $KPF_6$, $RbPF_6$, $CsPF_6$, $AgPF_6$, or any combination thereof.

3. The precursor delivery system of claim 1, wherein at least one heater is configured to heat at least one vessel body to a temperature that is greater than a thermal decomposition temperature of the solid precursor material.

4. The precursor delivery system of claim 1, wherein at least one heater is configured to maintain at least one vessel body at a temperature that is greater than a thermal decomposition temperature of the solid precursor material.

5. The precursor delivery system of claim 1, wherein the manifold is configured to control withdrawal of the gas precursor from each of the plurality of precursor supply packages.

6. The precursor delivery system of claim 1, further comprising a pressure transducer.

7. The precursor delivery system of claim 6, wherein a pressure below a set pressure as determined by the pressure transducer indicates the solid precursor material, which is contained in the vessel body of the precursor supply package producing the gas precursor, is depleted.

8. The precursor delivery system of claim 1, further comprising a pressure regulator valve.

9. The precursor delivery system of claim 8, wherein the pressure regulator valve is configured to maintain a pressure of the gas precursor through the outlet at or below atmospheric pressure.

* * * * *